(12) United States Patent
Sung

(10) Patent No.: US 7,799,599 B1
(45) Date of Patent: Sep. 21, 2010

(54) SINGLE CRYSTAL SILICON CARBIDE LAYERS ON DIAMOND AND ASSOCIATED METHODS

(76) Inventor: Chien-Min Sung, 4, Lane 32, Chung-Cheng Road, Tansui, Taipei County 251 (TW)

( * ) Notice: Subject to any disclaimer, the term of this patent is extended or adjusted under 35 U.S.C. 154(b) by 486 days.

(21) Appl. No.: 11/809,717

(22) Filed: May 31, 2007

(51) Int. Cl.
*H01L 21/00* (2006.01)
*H01L 31/0312* (2006.01)

(52) U.S. Cl. .......................... 438/105; 438/150; 257/77; 257/352

(58) Field of Classification Search .................. 438/105, 438/149, 150, 198, 479, 481, 482; 257/64, 257/77, 347, 352
See application file for complete search history.

(56) References Cited

U.S. PATENT DOCUMENTS

| | | | | |
|---|---|---|---|---|
| 4,981,818 A | * | 1/1991 | Anthony et al. | 438/494 |
| 5,034,784 A | * | 7/1991 | Yamazaki | 257/77 |
| 5,131,963 A | * | 7/1992 | Ravi | 148/33.3 |
| 2006/0243982 A1 | * | 11/2006 | Chang et al. | 257/77 |
| 2007/0082467 A1 | * | 4/2007 | Hata et al. | 438/483 |

* cited by examiner

*Primary Examiner*—Kevin M Picardat
(74) *Attorney, Agent, or Firm*—Thorpe North & Western LLP

(57) ABSTRACT

Semiconductor-on-diamond devices and methods for making such devices are provided. In one aspect, for example, a method for making a semiconductor-on-diamond substrate is provided, including depositing a conformal amorphous diamond layer on a single crystal Si base layer, thereby forming in situ a single crystal SiC layer therebetween, removing the amorphous diamond layer to expose the SiC layer, and epitaxially depositing a single crystal diamond layer on the SiC layer.

18 Claims, 2 Drawing Sheets

SINGLE CRYSTAL SILICON CARBIDE LAYERS ON DIAMOND AND ASSOCIATED METHODS

FIELD OF THE INVENTION

The present invention relates generally to methods and associated devices having SiC on diamond layers. Accordingly, the present invention involves the electrical and material science fields.

BACKGROUND OF THE INVENTION

In many developed countries, major portions of the populations consider electronic devices to be integral to their lives. Such increasing use and dependence has generated a demand for electronics devices that are smaller and faster. As electronic circuitry increases in speed and decreases in size, cooling of such devices becomes problematic.

Electronic devices generally contain printed circuit boards having integrally connected electronic components that allow the overall functionality of the device. These electronic components, such as processors, transistors, resistors, capacitors, light-emitting diodes (LEDs), etc., generate significant amounts of heat. As it builds, heat can cause various thermal problems associated with such electronic components. Significant amounts of heat can affect the reliability of an electronic device, or even cause it to fail by, for example, causing burn out or shorting both within the electronic components themselves and across the surface of the printed circuit board. Thus, the buildup of heat can ultimately affect the functional life of the electronic device. This is particularly problematic for electronic components with high power and high current demands, as well as for the printed circuit boards that support them.

Various cooling devices have been employed such as fans, heat sinks, Peltier and liquid cooling devices, etc., as means of reducing heat buildup in electronic devices. As increased speed and power consumption cause increasing heat buildup, such cooling devices generally must increase in size to be effective and may also require power to operate. For example, fans must be increased in size and speed to increase airflow, and heat sinks must be increased in size to increase heat capacity and surface area. The demand for smaller electronic devices, however, not only precludes increasing the size of such cooling devices, but may also require a significant size decrease.

As a result, methods and associated devices are being sought to provide adequate cooling of electronic devices while minimizing size and power constraints placed on such devices due to cooling.

SUMMARY OF THE INVENTION

Accordingly, the present invention provides methods of making semiconductor-on-diamond substrates, including such substrates. In one aspect, for example, a method for making a semiconductor-on-diamond substrate is provided, including depositing a conformal amorphous diamond layer on a single crystal Si base layer, thereby forming in situ a single crystal SiC layer therebetween, removing the amorphous diamond layer to expose the SiC layer, and epitaxially depositing a single crystal diamond layer on the SiC layer.

Such a semiconductor-on-diamond substrate may be intended for a number of uses, and the claim scope of the present invention should not be limited merely to the uses described herein. For example, in one aspect the semiconductor-on-diamond substrate may be utilized in the formation of various semiconductor devices. A useful substrate for the deposition of semiconductor materials may be made by coupling a support substrate to the single crystal diamond layer, and removing the Si base layer to expose the SiC layer. The single crystal SiC layer that is epitaxially coupled to the diamond layer thus provides such a useful deposition substrate for semiconductor materials. Thus, in one aspect the method may further include depositing a semiconductor layer on the SiC layer.

Various semiconductor materials are contemplated for deposition onto the SiC layer, and as such the present scope should not be limited to the examples given herein. In one aspect, however, non-limiting examples of semiconductor materials may include silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and combinations thereof. In one specific aspect, depositing the semiconductor layer may include depositing a layer of GaN. In another specific aspect, depositing the semiconductor layer may include depositing a layer of AlN. In yet another specific aspect, depositing the semiconductor layer may include depositing a layer of Si.

Because the SiC layer is formed in situ between the amorphous diamond layer and the Si base layer, the thickness of the SiC may vary depending on the particular conditions used during deposition, and depending on the intended use of the device. In one aspect, however, the SiC layer may be less than about 100 nanometers thick. In another aspect, the SiC layer may be less than about 1 nanometer thick. In yet another aspect, the SiC layer may be less than about 500 angstroms thick.

Similarly, the single crystal diamond layer may be produced in a variety of thicknesses, depending on the intended use of the resulting device. In one aspect, for example, the single crystal diamond layer may be from about 50 microns to about 100 microns thick. In another aspect, the single crystal diamond layer may be from about 10 microns to about 50 microns thick. In yet another aspect, the single crystal diamond layer may be less than or equal to about 10 microns thick. In a further aspect, the single crystal diamond layer may be an adynamic diamond layer.

The present invention also provides various devices containing diamond materials. For example, in one aspect a semiconductor-on-diamond substrate is provided. Such a substrate may include a single crystal Si base layer, an amorphous diamond layer formed on the single crystal Si base layer, and a single crystal SiC layer disposed between the Si base layer and the amorphous diamond layer, such that the single crystal SiC layer is epitaxially coupled to the single crystal Si base layer.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

DETAILED DESCRIPTION OF THE INVENTION

Definitions

Figure 1:
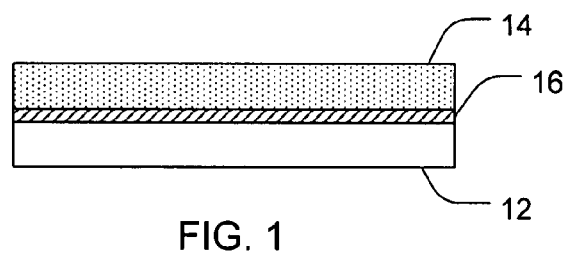
FIG. 1 is a cross-section view of a semiconductor substrate being constructed in accordance with one embodiment of the present invention.

In describing and claiming the present invention, the following terminology will be used in accordance with the definitions set forth below.

The singular forms "a," "an," and, "the" include plural referents unless the context clearly dictates otherwise. Thus, for example, reference to "a heat source" includes reference to one or more of such sources, and reference to "the diamond layer" includes reference to one or more of such layers.

The terms "heat transfer," "heat movement," and "heat transmission" can be used interchangeably, and refer to the movement of heat from an area of higher temperature to an area of cooler temperature. It is intended that the movement of heat include any mechanism of heat transmission known to one skilled in the art, such as, without limitation, conductive, convective, radiative, etc.

As used herein, "vapor deposited" refers to materials which are formed using vapor deposition techniques. "Vapor deposition" refers to a process of depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), laser ablation, conformal diamond coating processes, metal-organic CVD (MOCVD), sputtering, thermal evaporation PVD, ionized metal PVD (IMPVD), electron beam PVD (EBPVD), reactive PVD, and the like.

As used herein, "chemical vapor deposition," or "CVD" refers to any method of chemically depositing diamond particles in a vapor form upon a surface. Various CVD techniques are well known in the art.

As used herein, "physical vapor deposition," or "PVD" refers to any method of physically depositing diamond particles in a vapor form upon a surface. Various PVD techniques are well known in the art.

As used herein, "conformal" refers to a diamond coating that has formed without the use of distinct crystalline seeds on a growth surface. Accordingly, in one aspect a conformal diamond coating is initiated across substantially all of the growth surface simultaneously, thus minimizing crystal dislocations in the growing coating. Examples of conformal techniques are described in more detail herein.

As used herein, "diamond" refers to a crystalline structure of carbon atoms bonded to other carbon atoms in a lattice of tetrahedral coordination known as $sp^3$ bonding. Specifically, each carbon atom is surrounded by and bonded to four other carbon atoms, each located on the tip of a regular tetrahedron. Further, the bond length between any two carbon atoms is 1.54 angstroms at ambient temperature conditions, and the angle between any two bonds is 109 degrees, 28 minutes, and 16 seconds although experimental results may vary slightly. The structure and nature of diamond, including its physical and electrical properties are well known in the art.

As used herein, "distorted tetrahedral coordination" refers to a tetrahedral bonding configuration of carbon atoms that is irregular, or has deviated from the normal tetrahedron configuration of diamond as described above. Such distortion generally results in lengthening of some bonds and shortening of others, as well as the variation of the bond angles between the bonds. Additionally, the distortion of the tetrahedron alters the characteristics and properties of the carbon to effectively lie between the characteristics of carbon bonded in $sp^3$ configuration (i.e. diamond) and carbon bonded in $sp^2$ configuration (i.e. graphite). One example of material having carbon atoms bonded in distorted tetrahedral bonding is amorphous diamond.

As used herein, "diamond-like carbon" refers to a carbonaceous material having carbon atoms as the majority element, with a substantial amount of such carbon atoms bonded in distorted tetrahedral coordination. Diamond-like carbon (DLC) can typically be formed by PVD processes, although CVD or other processes could be used such as vapor deposition processes. Notably, a variety of other elements can be included in the DLC material as either impurities, or as dopants, including without limitation, hydrogen, sulfur, phosphorous, boron, nitrogen, silicon, tungsten, etc.

As used herein, "amorphous diamond" refers to a type of diamond-like carbon having carbon atoms as the majority element, with a substantial amount of such carbon atoms bonded in distorted tetrahedral coordination. In one aspect, the amount of carbon in the amorphous diamond can be at least about 90%, with at least about 20% of such carbon being bonded in distorted tetrahedral coordination. Amorphous diamond also has a higher atomic density than that of diamond (176 atoms/cm$^3$). Further, amorphous diamond and diamond materials contract upon melting.

As used herein, "adynamic" refers to a type of layer which is unable to independently retain its shape and/or strength. For example, in the absence of a mold or support layer, an adynamic diamond layer will tend to curl or otherwise deform when the mold or support surface is removed. While a number of reasons may contribute to the adynamic properties of a layer, in one aspect, the reason may be the extreme thinness of the layer.

As used herein, "substrate" refers to a support surface to which various materials can be joined in forming a semiconductor or semiconductor-on-diamond device. The substrate may be any shape, thickness, or material, required in order to achieve a specific result, and includes but is not limited to metals, alloys, ceramics, and mixtures thereof. Further, in some aspects, the substrate may be an existing semiconductor device or wafer, or may be a material which is capable of being joined to a suitable device.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially" free of particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Invention

The present invention provides semiconductor devices having incorporated diamond layers and methods of making such devices. Semiconductor devices are often challenging to cool, particularly for high powered devices such as LEDs. Much of the heat generated by semiconductor devices is collected within the device, thus placing thermal limits on the operation of such devices. The collection of heat within the devices may be due to a variety of factors, including poor thermal conductivity of the materials making up the layers of the devices, the degree of crystal lattice mismatch between adjacent layers of the devices, etc.

Diamond materials have good thermally conductive properties, and as such, may be useful materials for incorporation into many semiconductor devices. Such materials may function to increase the flow of heat laterally through the semiconductor device to reduce the amount of heat trapped within the semiconductor layers. Lateral heat transmission may thus effectively improve the thermal properties of many semiconductor devices. Very little success has been achieved in incorporating diamond materials into semiconductor devices, however, due to a high degree of lattice mismatch between the diamond material and the underlying substrate. A high degree of lattice mismatch often results in the creation of strictly polycrystalline diamond layers that tend to be less effective at heat transfer as compared to single crystal diamond layers.

The transfer of heat that is present in a semiconductor device can thus be accelerated from the device through a diamond layer. One factor that may limit the efficiency of acceleration of heat through the diamond layer is dislocations or other defects in the diamond crystal lattice. In such cases, heat tends to collect along such dislocations, thus decreasing the thermal conductivity of the diamond material. Accordingly, diamond materials having a single crystal orientation with few if any crystal dislocations will conduct heat more efficiently than diamond materials having a more polycrystalline nature. Similarly, the nature of the interface between the diamond layer and any layer to which the diamond layer is coupled may also effect the efficiency of heat transfer. For example, a diamond layer that is glued or brazed to a substrate will collect heat along the interface due to the lattice mismatch there between. Accordingly, the closer the crystal lattices of adjacent layers match one another, the more effective will be the heat transfer from one layer to another.

Accordingly, the present invention provides novel methods for epitaxially depositing a single crystal diamond layer onto a Si substrate, including devices made by such methods and uses for these devices. It has now been discovered that such a single crystal diamond layer may be formed through the use of a single crystal SiC interlayer. Additionally, the present invention provides techniques for lattice matching the SiC crystal lattice and the diamond crystal lattice to thus more effectively transfer heat therebetween. It should be noted that the beneficial properties provided by the diamond layer may extend beyond cooling, and as such, the present scope should not be limited thereto. Additionally, any type of semiconductor device known to generate heat would be considered to be within the scope of the present invention. Specific examples may include, without limitation, LEDs, laser diodes, acoustic filters such as surface acoustic wave (SAW) and bulk acoustic wave (BAW) filters, integrated circuit (IC) chips, conductive traces, etc.

SiC layers have been used previously in attempts to incorporate diamond materials into semiconductor devices. Such attempts have failed, however, to provide a substrate suitable for the epitaxial deposition of a single crystal diamond layer, but rather have most often been used for the deposition of polycrystalline diamond layers. Accordingly, in one aspect a method for making a single crystal diamond layer is provided. Such a method may include depositing a conformal amorphous diamond layer on a single crystal Si base layer, thereby forming in situ a single crystal SiC layer therebetween, removing the amorphous diamond layer to expose the SiC layer, and epitaxially depositing a single crystal diamond layer on the SiC layer. Additional techniques for forming such a SiC layer are further discussed in the Applicant's copending U.S. patent application entitled "Graded Crystalline Materials And Associated Methods", and filed on May 31, 2007 under Ser. No. 11/809,806, which is incorporated herein by reference.

As is shown in FIG. 1, a conformal amorphous diamond layer 14 may be deposited onto a single crystal Si wafer 12 to thus form a single crystal SiC layer 16 therebetween. Although deposition orientation may vary depending on the intended crystal orientation of the SiC layer, in one aspect the amorphous diamond may be deposited on a (100) face of the Si wafer, or base layer. In another aspect, the amorphous diamond may be deposited on a (111) face of the Si wafer.

Conformal diamond growth techniques, described in more detail below, may be used to cause the initiation of growth of the amorphous diamond layer across the entire growth surface substantially simultaneously. It should be noted that, although much of the description for initiating simultaneous growth of a diamond material taught herein is directed toward conformal diamond growth techniques, any method for growing diamond whereby initiation occurs across substantially simultaneously the entire growth surface may be considered to be within the scope of the present invention. Regardless of the method, simultaneous growth initiation of the amorphous diamond layer thus allows the formation of an epitaxial single crystal SiC layer by reducing the likelihood of crystal dislocations in the SiC layer imposed by the deposited amorphous diamond material. If, on the other hand, crystalline diamond materials are deposited on a Si layer, a SiC layer having numerous crystal dislocations in the lattice is formed due to the numerous nucleation sites of the forming crystalline diamond layer. These dislocations are formed due to the nucleation of the crystalline diamond layer on the Si layer as a result of seeding. As individual seeded crystals originating at distinct nucleation sites grow towards one another, dislocations are often formed due to the varied crystal orientations of the growing crystals, thus forming a polycrystalline diamond layer. Such crystal dislocations are avoided by the methods according to aspects of the present invention because of, among other things, the amorphous nature of the diamond layer used to create the SiC layer, and the conformal deposition of the amorphous diamond layer to simultaneously initiate growth across the entire growth surface.

Conformal diamond coating processes can provide a number of advantages over conventional diamond film processes. Conformal diamond coating can be performed on a wide variety of substrates, including non-planar substrates. To initiate a conformal diamond coating, a growth surface can be pretreated under diamond growth conditions in the absence of a bias to form a carbon film. The diamond growth conditions can be conditions that are conventional CVD deposition conditions for diamond without an applied bias. As a result, a thin carbon film can be formed which is typically less than about 100 angstroms. The pretreatment step can be performed at almost any growth temperature such as from about 200° C. to about 900° C., although lower temperatures below about 500° C. may be preferred. Without being bound to any particular theory, the thin carbon film appears to form within a short time, e.g., less than one hour, and is a hydrogen terminated amorphous carbon.

Following formation of the thin carbon film, the growth surface may then be subjected to diamond growth conditions to form the amorphous diamond layer. The diamond growth conditions may be those conditions which are commonly used in traditional CVD diamond growth. However, unlike conventional amorphous diamond film growth, the amorphous diamond film produced using the above pretreatment steps results in a conformal amorphous diamond film that typically begins growth substantially over the entire growth surface with substantially no incubation time.

Figure 2:
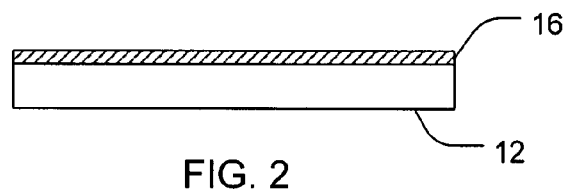
FIG. 2 is a cross-section view of a semiconductor substrate being constructed in accordance with another embodiment of the present invention.

As is shown in FIG. 2, the amorphous diamond layer is subsequently removed from the single crystal Si wafer 12 to expose the SiC layer 16. The amorphous diamond layer may be removed by any means known to one of ordinary skill in the art that does not damage the underlying SiC layer. Such methods may include abrading, chemical etching, mechanical and chemical polishing, etc.

In some aspects the SiC layer may be further processed by polishing, etching, thickening, etc., in preparation for further deposition. For example, a thick SiC layer is not necessarily required for the deposition of the single crystal diamond layer, however, in some cases the SiC layer may be further thickened. In other aspects, very thin SiC layers may be desirable. Accordingly, the SiC layer may be of a variety of thicknesses, depending on the intended use of the structure and/or the methods used to construct the layer. In one aspect, however, the SiC may be less than about 100 nanometers thick. In another aspect the SiC layer may be less than about 1 nanometer thick. In yet another aspect, the SiC layer may be less than about 500 angstroms thick.

Figure 3:
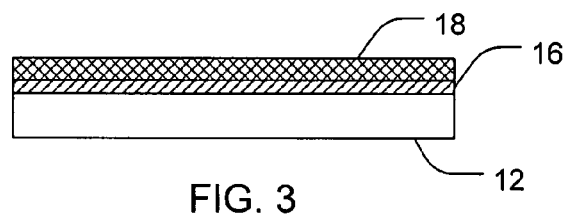
FIG. 3 is a cross-section view of a semiconductor device in accordance with yet another embodiment of the present invention.

As is shown in FIG. 3, a single crystal diamond layer 18 may be epitaxially depositing on the SiC layer 16. Due to the single crystal orientation of the SiC layer 16, the diamond material deposited thereon will epitaxially form into a single crystal diamond layer 18 that matches the crystal orientation of the SiC layer 16.

Generally, diamond layers, including both the single crystal and amorphous diamond layers of the present invention, may be formed by any means known, including various vapor deposition techniques. Any number of known vapor deposition techniques may be used to form these diamond layers. The most common vapor deposition techniques include CVD and PVD, although any similar method can be used if similar properties and results are obtained. In one aspect, CVD techniques such as hot filament, microwave plasma, oxyacetylene flame, rf-CVD, laser CVD (LCVD), metal-organic CVD (MOCVD), laser ablation, further conformal diamond coating processes, and direct current arc techniques may be utilized. Typical CVD techniques use gas reactants to deposit the diamond material in a layer, or film. These gases generally include a small amount (i.e. less than about 5%) of a carbonaceous material, such as methane, diluted in hydrogen. A variety of specific CVD processes, including equipment and conditions, as well as those used for boron nitride layers, are well known to those skilled in the art. In another aspect, PVD techniques such as sputtering, cathodic arc, and thermal evaporation may be utilized. Further, specific deposition conditions may be used in order to adjust the exact type of material to be deposited, whether amorphous diamond or pure diamond.

The single crystal diamond layer may be of any thickness that would allow cooling according to the methods and devices of the present invention. Thicknesses may vary depending on the application and the semiconductor device configuration. For example, greater cooling requirements may require a slightly thicker diamond layer. The thickness may also vary depending on the materials used in construction of the device. That being said, in one aspect the single crystal diamond layer may be from about 50 microns to about 100 microns thick. In another aspect, the single crystal diamond layer may be from about 10 microns to about 50 microns thick. In yet another aspect, the single crystal diamond layer may be less than or equal to about 10 microns thick. In a further aspect, the single crystal diamond layer may be an adynamic diamond layer. Such an adynamic diamond layer is not self supporting, and thus may require support from an associated substrate. As such, an adynamic layer may be of any thickness that is not self-supporting. For example, in one aspect an adynamic diamond layer may be less than about 30 microns. In another example, an adynamic diamond layer may be from about 5 microns to about 20 microns.

Figure 4:
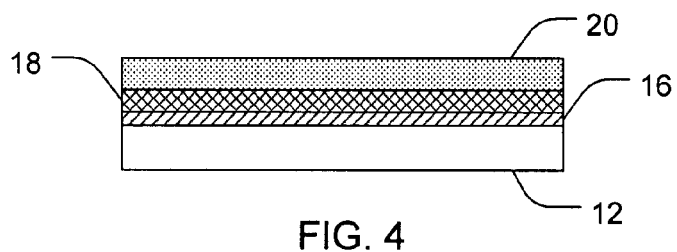
FIG. 4 is a cross-section view of a semiconductor device in accordance with a further embodiment of the present invention.

As is shown in FIG. 4, a support substrate 20 is then coupled to the single crystal diamond layer 18. Coupling of the support substrate 20 may be accomplished by a variety of techniques, depending on the support substrate material. Non-limiting examples of coupling techniques may include gluing, brazing, vapor deposition, etc. Furthermore, the support substrate 20 may be made from numerous materials that would all be considered to be within the scope of the present invention. For example, the support substrate 20 may be made from a semiconducting material or a non-semiconducting material, depending on the intended use of the device. Non-limiting examples of semiconducting materials that may be used include silicon, silicon carbide, silicon germanium, sapphire, aluminum arsenide, aluminum phosphide, gallium arsenide, gallium phosphide, gallium nitride, and combinations thereof. In one specific aspect, the semiconductor substrate may be silicon. Non-limiting examples of non-semiconducting materials may include glass, metals, ceramics, resins, polymers, graphite, and combinations thereof.

Figure 5:
FIG. 5 is a cross-section view of a semiconductor device in accordance with another embodiment of the present invention.

Following coupling of the support substrate 20 to the single crystal diamond layer 18, the single crystal Si wafer may be removed to expose the SiC layer 16, as is shown in FIG. 5. The exposed SiC layer 16 is lattice matched to the single crystal diamond layer 18, and thus provides a substrate for the epitaxial deposition of subsequent layers. The Si wafer may be removed using any known method, including abrading, chemical etching, splitting, etc.

Figure 6:
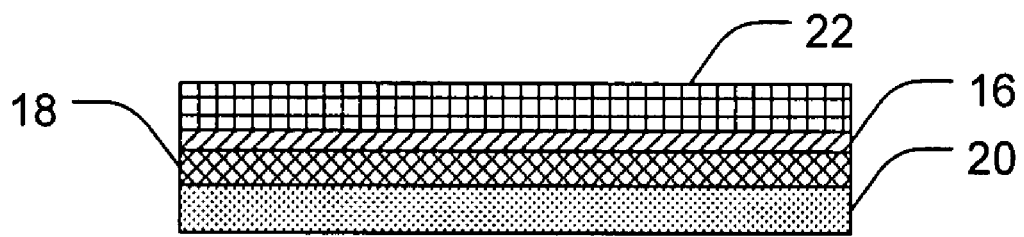
FIG. 6 is a cross-section view of a semiconductor device in accordance with yet another embodiment of the present invention.

FIG. 6 shows a semiconductor layer 22 epitaxially deposited onto the SiC layer 16. Because of this epitaxial relationship, the crystal lattices of the semiconductor layer 22, the SiC layer 16, and the single crystal diamond layer 18 are significantly lattice matches, and thus exhibit few if any crystal dislocations within each layer. Additionally, the epitaxial deposition of each layer upon a single crystal substrate, e.g. the single crystal diamond layer 18 on the SiC layer 16, results in few if any dislocations along the boundaries between layers. As such, heat can be more effectively transferred from the semiconductor layer 22 through the SiC layer 16 and into the single crystal diamond layer 18 as compared to similar structures having significant amounts of crystal dislocations. Thus such a structure can more effectively cool semiconductor structures disposed thereon.

The semiconductor layer 22 may be deposited on the SiC layer 16 using a variety of techniques known to those of ordinary skill in the art. One example of such a technique is MOCVD processes. The semiconductor layer 22 may comprise any material that is suitable for forming electronic devices, semiconductor devices, or the like. Many semiconductors are based on silicon, gallium, indium, and germanium. However, suitable materials for the semiconductor layer can include, without limitation, silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and composites thereof. In one aspect, however, the semiconductor layer can comprise silicon, silicon carbide, gallium arsenide, gallium nitride, gallium phosphide, aluminum nitride, indium nitride, indium gallium nitride, aluminum gallium nitride, or composites of these materials. In some additional embodiments, non-silicon based devices can be formed such as those based on gallium arsenide, gallium nitride, germanium, boron nitride, aluminum nitride, indium-based materials, and composites thereof. In another embodiment, the semiconductor layer can comprise gallium nitride, indium gallium nitride, indium nitride, and combinations thereof. In one specific aspect, the semiconductor material is gallium nitride. In another specific aspect, the semiconductor material is aluminum nitride. Other semiconductor materials which can be used include $Al_2O_3$, BeO, W, Mo, c-$Y_2O_3$, c-$(Y_{0.9}La_{0.1})_2O_3$, c-$Al_{23}O_{27}N_5$, c-$MgAl_2O_4$, t-$MgF_2$, graphite, and mixtures thereof. It should be understood that the semiconductor layer may include any semiconductor material known, and should not be limited to those materials described herein. Additionally, semiconductor materials may be of any structural configuration known, for example, without limitation, cubic (zincblende or sphalerite), wurtzitic, rhombohedral, graphitic, turbostratic, pyrolytic, hexagonal, amorphous, or combinations thereof. As has been described, the semiconductor layer 22 may be deposited by any method known to one of ordinary skill in the art. Various known methods of vapor deposition can be utilized to deposit such layers and that allow deposition to occur in a graded manner. It should be noted that surface processing may be performed between any of the deposition steps described in order to provide a smooth surface for subsequent deposition. Such processing may be accomplished by any means known, such as by chemical etching, polishing, buffing, grinding, etc.

As they have become increasingly important in electronics and lighting devices, LEDs continue to be developed that have ever increasing power requirements. This trend of increasing power has created cooling problems for these devices. These cooling problems can be exacerbated by the typically small size of these devices, which may render heat sinks with traditional aluminum heat fins ineffective due to their bulky nature. Additionally, such traditional heat sinks would block the emission of light if applied to the light-emitting surface of the LED. Utilizing an LED substrate having a single crystal diamond layer allows adequate cooling even at high power, while maintaining a small LED package size. Additionally, in one aspect the maximum operating wattage of an LED may be exceeded by drawing heat from the semiconductor layers of the LED with a diamond layer in order to operate the LED at an operating wattage that is higher than the maximum operating wattage for that LED. In one example of such a device, the semiconductor layer may be GaN, MN, or a combination thereof.

EXAMPLES

The following examples illustrate various techniques of making a semiconductor device according to aspects of the present invention. However, it is to be understood that the following are only exemplary or illustrative of the application of the principles of the present invention. Numerous modifications and alternative compositions, methods, and systems can be devised by those skilled in the art without departing from the spirit and scope of the present invention. The appended claims are intended to cover such modifications and arrangements. Thus, while the present invention has been described above with particularity, the following Examples provide further detail in connection with several specific embodiments of the invention.

Example 1

A semiconductor substrate may be formed as follows:

A single crystal Si wafer is obtained and cleaned by soaking in KOH and ultrasound cleaning with distilled water to remove any non-crystalline Si and foreign debris. A conformal amorphous carbon coating is applied to the cleaned surface of the Si wafer by exposing the wafer to CVD deposition conditions without an applied bias. Following carbonization of the surface, amorphous diamond is deposited for approximately 30 minutes at 800° in 1% $CH_4$ and 99% $H_2$. The amorphous carbon coating is then removed with $H_2$ or $F_2$ treatment for about 60 minutes, at 900°. Removal of the amorphous carbon coating exposes an epitaxial SiC layer that has formed in situ between the Si wafer and the amorphous carbon coating. The thickness of the SiC layer is approximately 10 nm.

A transparent diamond coating 10 microns thick is then deposited onto the SiC layer by CVD deposition of $CH_4$ for approximately 10 hours. After 10 hours, the $CH_4$ source is then switched to $SiH_4$ for approximately 10 minutes to deposit a 1 micron thick Si layer.

A Si carrier substrate having a $SiO_2$ surface is wafer bonded to the 1 micron thick Si layer at the $SiO_2$ surface. Following wafer bonding, the single crystal Si wafer is removed to expose the SiC layer by etching with $HF+3HNO_2+H_2O$. Further details regarding etching Si materials may be found in U.S. Pat. No. 4,981,818, which is incorporated herein by reference.

Example 2

An LED device may be constructed as follows:

A semiconductor substrate is obtained as in Example 1. GaN semiconductor layers are deposited onto the exposed SiC layer by MOCVD with $GaH_3$ and $NH_3$ source materials.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method for making a semiconductor-on-diamond substrate, comprising:
    depositing a conformal amorphous diamond layer on a single crystal Si base layer, thereby forming in situ a single crystal SiC layer therebetween;
    removing the amorphous diamond layer to expose the SiC layer; and
    epitaxially depositing a single crystal diamond layer on the SiC layer.

2. The method of claim 1, further comprising:
    coupling a support substrate to the single crystal diamond layer; and
    removing the Si base layer to expose the SiC layer.

3. The method of claim 2, further comprising depositing a semiconductor layer on the SiC layer.

4. The method of claim 1, wherein the conformal amorphous diamond layer is deposited on a (100) face of the Si base layer.

5. The method of claim 1, wherein the conformal amorphous diamond layer is deposited on a (111) face of the Si base layer.

6. The method of claim 3, wherein depositing the semiconductor layer further includes depositing the semiconductor layer epitaxially on the SiC layer.

7. The method of claim 3, wherein depositing the semiconductor layer further includes depositing a member selected from the group consisting of silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and combinations thereof.

8. The method of claim 3, wherein depositing the semiconductor layer further includes depositing a layer of GaN.

9. The method of claim 3, wherein depositing the semiconductor layer further includes depositing a layer of AlN.

10. The method of claim 3, wherein depositing the semiconductor layer further includes depositing a layer of Si.

11. The method of claim 1, wherein the SiC layer is less than about 100 nanometers thick.

12. The method of claim 1, wherein the SiC layer is less than about 1 nanometer thick.

13. The method of claim 1, wherein the SiC layer is less than about 500 angstroms thick.

14. The method of claim 1, wherein the single crystal diamond layer is from about 50 microns to about 100 microns thick.

15. The method of claim 1, wherein the single crystal diamond layer is from about 10 microns to about 50 microns thick.

16. The method of claim 1, wherein the single crystal diamond layer is less than or equal to about 10 microns thick.

17. The method of claim 1, wherein the single crystal diamond layer is an adynamic diamond layer.

18. A semiconductor-on-diamond substrate, comprising:
    a single crystal Si base layer;
    an amorphous diamond layer formed on the single crystal Si base layer; and
    a single crystal SiC layer disposed between the Si base layer and the amorphous diamond layer, such that the single crystal SiC layer is epitaxially coupled to the single crystal Si base layer.

* * * * *